United States Patent
Griebenow et al.

(10) Patent No.: US 8,034,669 B2
(45) Date of Patent: Oct. 11, 2011

(54) DRIVE CURRENT ADJUSTMENT FOR TRANSISTORS FORMED IN THE SAME ACTIVE REGION BY LOCALLY PROVIDING EMBEDDED STRAIN-INDUCING SEMICONDUCTOR MATERIAL IN THE ACTIVE REGION

(75) Inventors: Uwe Griebenow, Markkleeberg (DE); Jan Hoentschel, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 77 days.

(21) Appl. No.: 12/507,544

(22) Filed: Jul. 22, 2009

(65) Prior Publication Data

US 2010/0052068 A1    Mar. 4, 2010

(30) Foreign Application Priority Data

Aug. 29, 2008    (DE) .................. 10 2008 045 034

(51) Int. Cl.
*H01L 21/82* (2006.01)
(52) U.S. Cl. ........ 438/130; 438/505; 438/480; 257/289; 257/E21.64; 257/E29.096; 257/E29.093
(58) Field of Classification Search .............. 438/130, 438/213, 229, 480, 505, 509; 257/289, 402, 257/E21.64, E21.611, E29.096
See application file for complete search history.

(56) References Cited

U.S. PATENT DOCUMENTS

| | | | |
|---|---|---|---|
| 2005/0224798 A1 | 10/2005 | Buss | 257/65 |
| 2005/0285202 A1 | 12/2005 | Huang et al. | 257/368 |
| 2006/0011984 A1* | 1/2006 | Currie | 257/352 |
| 2007/0063278 A1 | 3/2007 | Doris et al. | 257/347 |
| 2007/0164364 A1 | 7/2007 | Kawasaki | 257/368 |
| 2007/0187770 A1 | 8/2007 | Ahn et al. | 257/369 |
| 2007/0235817 A1* | 10/2007 | Wang et al. | 257/392 |
| 2007/0236982 A1* | 10/2007 | Chuang et al. | 365/154 |
| 2007/0253239 A1* | 11/2007 | Wang et al. | 365/154 |
| 2007/0290192 A1 | 12/2007 | Rotondaro | 257/19 |
| 2008/0054364 A1 | 3/2008 | Hokazono | 257/369 |
| 2008/0099786 A1* | 5/2008 | Maeda et al. | 257/190 |
| 2008/0237732 A1* | 10/2008 | Mori et al. | 257/371 |

(Continued)

FOREIGN PATENT DOCUMENTS

DE    102006015090 A1    10/2007

(Continued)

OTHER PUBLICATIONS

Translation of Official Communication from German Patent Office for German Patent Application No. 10 2008 045 034.0 dated May 25, 2009.

(Continued)

*Primary Examiner* — Caridad Everhart
(74) *Attorney, Agent, or Firm* — Williams, Morgan & Amerson, P.C.

(57) ABSTRACT

The drive current capability of a pull-down transistor and a pass transistor formed in a common active region may be adjusted on the basis of different strain levels obtained by providing at least one embedded semiconductor alloy in the active region, thereby providing a simplified overall geometric configuration of the active region. Hence, static RAM cells may be formed on the basis of a minimum channel length with a simplified configuration of the active region, thereby avoiding significant yield losses as may be observed in sophisticated devices, in which a pronounced variation of the transistor width is conventionally used to adjust the ratio of the drive currents for the pull-down and pass transistors.

17 Claims, 9 Drawing Sheets

U.S. PATENT DOCUMENTS

| | | | |
|---|---|---|---|
| 2009/0189227 A1 | 7/2009 | Miyashita | 257/393 |
| 2009/0236633 A1* | 9/2009 | Chuang et al. | 257/190 |
| 2009/0289379 A1* | 11/2009 | Han et al. | 257/E21.431 |

FOREIGN PATENT DOCUMENTS

| | | |
|---|---|---|
| JP | 2007027194 | 2/2007 |

OTHER PUBLICATIONS

PCT Search Report from PCT/EP2009/006259 dated Mar. 4, 2010.
PCT Preliminary Report on Patentability from PCT/EP2009/006259 dated Nov. 11, 2010.

* cited by examiner

DRIVE CURRENT ADJUSTMENT FOR TRANSISTORS FORMED IN THE SAME ACTIVE REGION BY LOCALLY PROVIDING EMBEDDED STRAIN-INDUCING SEMICONDUCTOR MATERIAL IN THE ACTIVE REGION

BACKGROUND OF THE INVENTION

1. Field of the Invention

Generally, the present disclosure relates to integrated circuits, and, more particularly, to the manufacture of field effect transistors in complex circuits including memory areas, for instance, in the form of a cache memory of a CPU.

2. Description of the Related Art

Integrated circuits comprise a large number of circuit elements on a given chip area according to a specified circuit layout, wherein transistor elements represent one of the major semiconductor elements in the integrated circuits. Hence, the characteristics of the individual transistors significantly affect overall performance of the complete integrated circuit. Generally, a plurality of process technologies are currently practiced, wherein, for complex circuitry, such as microprocessors, storage chips, ASICs (application specific ICs) and the like, MOS technology is currently one of the most promising approaches due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the latter aspect renders the reduction of the channel length, and associated therewith the reduction of the channel resistivity, a dominant design criterion for accomplishing an increase in the operating speed of the integrated circuits.

On the other hand, the drive current capability of the MOS transistors also depends on the transistor width, i.e., the extension of the transistor in a direction perpendicular to the current flow direction, so that the gate length and thus the channel length, in combination with the transistor width, are dominant geometric parameters which substantially determine the overall transistor characteristics in combination with "transistor internal" parameters, such as overall charge carrier mobility, threshold voltage, i.e., a voltage at which a conductive channel forms below the gate insulation layer upon applying a control signal to the gate electrode, and the like.

On the basis of field effect transistors, such as N-channel transistors and/or P-channel transistors, more complex circuit components may be created, depending on the overall circuit layout. For instance, storage elements in the form of registers, static RAM (random access memory), may represent important components of complex logic circuitries. For example, during the operation of complex CPU cores, a large amount of data has to be temporarily stored and retrieved, wherein the operating speed and the capacity of the storage elements have a significant influence on the overall performance of the CPU. Depending on the memory hierarchy used in a complex integrated circuit, different types of memory elements are used. For instance, registers and static RAM cells are typically used in the CPU core due to their superior access time, while dynamic RAM elements are preferably used as working memory due to the increased bit density compared to registers or static RAM cells. Typically, a dynamic RAM cell comprises a storage capacitor and a single transistor wherein, however, a complex memory management system is required so as to periodically refresh the charge stored in the storage capacitors which may otherwise be lost due to unavoidable leakage currents. Although the bit density of dynamic RAM devices may be very high, a charge has to be transferred from and to the storage capacitors in combination with periodic refresh pulses, thereby rendering these devices less efficient in terms of speed and power consumption compared to static RAM cells. Thus, static RAM cells may be advantageously used as high speed memory with moderately high power consumption, thereby, however, requiring a plurality of transistor elements so as to allow the reliable storage of an information bit.

FIG. 1a schematically illustrates a circuit diagram of a static RAM cell 150 in a configuration as may typically be used in modern integrated circuits. The cell 150 comprises a storage element 151, which may include two inversely coupled inverters 152A, 152B, each of which may include a couple of transistors 100B, 100C. For example, in a CMOS device, the transistors 100B, 100C may represent an N-channel transistor and a P-channel transistor, respectively, while, in other cases, transistors of the same conductivity type, such as N-channel transistors, may be used for both the transistors 100B and 100C. A corresponding arrangement of N-channel transistors for the upper transistors 100C is illustrated at the right-hand side of FIG. 1a. Moreover, respective pass or pass gate transistors 100A may typically be provided so as to allow a connection to the bit cell 151 for read and write operations, during which the pass transistors 100A may connect the bit cell 151 to corresponding bit lines (not shown), while the gate electrodes of the pass transistors 100A may represent word lines of the memory cell 150. Thus, as illustrated in FIG. 1a, six transistors may be required to store one bit of information, thereby providing a reduced bit density for the benefit of a moderately high operating speed of the memory cell 150, as previously explained. Depending on the overall design strategy, the memory cell 150 may require the various transistor elements 100A, 100B, 100C to have different characteristics with respect to drive current capability in order to provide reliable operational behavior during read and write operations. For example, in many design strategies, the transistor elements are provided with minimum transistor lengths, wherein the drive current capability of the transistors 100B, which may also be referred to as pull-down transistors, may be selected to be significantly higher compared to the drive current capability of the pass transistors 100A, which may be accomplished by appropriately adjusting the respective transistor width dimensions for the given desired minimum transistor length.

FIG. 1b schematically illustrates a top view of a portion of the memory cell 150 as a hardware configuration in the form of a semiconductor device. As illustrated, the device 150 comprises a silicon-based semiconductor layer 102, in which an active region 103 is defined, for instance, by providing a respective isolation structure 104 that laterally encloses the active region 103, thereby defining the geometric shape and size of the transistors 100A, 100B. As illustrated, the transistors 100A, 100B may be formed in and above the same active region 103 since both transistors may have the same conductivity type and may be connected via a common node, as is for instance illustrated as nodes 153A, 153B in FIG. 1a. As previously explained, the transistors 100A, 100B, i.e., the pass transistor and the pull-down transistor, may have substantially the same length so that respective gate electrodes 106 may have substantially the same length 106L, whereas a transistor width 103B of the pull-down transistor 100B may be greater compared to a transistor width 103A of the pass transistor 100A, in order to establish the different current capabilities of these transistors.

FIG. 1c schematically illustrates a cross-sectional view taken along the line 1c of FIG. 1b. As illustrated, the device 150 comprises a substrate 101 which may typically be provided in the form of a silicon substrate, possibly in combination with a buried insulating layer (not shown) if a silicon-on-insulator (SOI) is considered. Above the substrate 101 and a possible buried insulating layer, the semiconductor layer 102, in the form of a silicon layer, is provided, in which the isolation structure 104 (see FIG. 1b) may be formed according to the desired shape so as to define the active region 103 according to the configuration as shown in FIG. 1b. That is, the active region 103 has the width 103B in the transistor 100B and has the width 103A in the transistor 100A. In this respect, an active semiconductor region is to be understood as a semiconductor region having an appropriate dopant concentration and profile so as to form one or more transistor elements in and above the active region, which have the same conductivity type. For example, the active region 103 may be provided in the form of a lightly P-doped semiconductor material, for instance in the form of a P-well, when the semiconductor layer 102 may extend down to a depth that is significantly greater than the depth dimension of the transistors 100A, 100B, when the transistors 100A, 100B may represent N-channel transistors. Similarly, the active region 103 may represent a basically N-doped region when the transistors 100A, 100B represent P-channel transistors. Furthermore, in the manufacturing stage shown in FIG. 1c, the transistors 100A, 100B may comprise the gate electrode 106, for instance in the form of a polysilicon material, which is separated from a channel region 109 by a gate insulation layer 108. Furthermore, depending on the overall process strategy, a sidewall spacer structure 107 may be formed on sidewalls of the gate electrodes 106. Additionally, drain and source regions 110 may be formed in the active region 103 and may connect the transistors 100A, 100B. Typically, metal silicide regions 111 are provided in the gate electrode 106 and an upper portion of the drain and source regions 110 so as to reduce contact resistance of these areas.

The device 150 is typically formed on the basis of the following processes. First, the isolation structure 104 may be formed, for instance, as a shallow trench isolation by etching respective openings into the semiconductor layer 102 down to a specific depth, which may even extend to a buried insulating layer, if provided. Thereafter, the corresponding openings may be filled with an insulating material by deposition and oxidation processes, followed by a planarization such as chemical mechanical polishing (CMP) and the like. During the process sequence for the isolation structure 104, advanced lithography techniques may have to be used in order to form a corresponding etch mask, which substantially corresponds to the shape of the active region 103, which requires the definition of a moderately narrow trench to obtain the desired reduced width 103A of the transistor 100A. Thereafter, the basic doping in the active region 103 may be provided by performing respective implantation sequences, which may also include sophisticated implantation techniques for introducing dopants for defining the channel doping and the like. Next, the gate insulation layers 108 and the gate electrodes 106 may be formed by depositing, oxidizing and the like an appropriate material for the gate insulation layer 106, followed by the deposition of an appropriate gate electrode material, such as polysilicon. Subsequently, the material layers are patterned by using advanced lithography and etch techniques, during which the actual length 106L of the gate electrodes 106 may be adjusted, thereby requiring extremely advanced process techniques so as to obtain a gate length of approximately 50 nm and less. Next, a part of the drain and source regions 110 may be formed by implanting appropriate dopant species followed by the formation of the spacer structure 107, or at least a portion thereof, followed by a subsequent implantation process for defining the deep drain and source areas, wherein a corresponding implantation sequence may be repeated on the basis of an additional spacer structure if sophisticated lateral concentration profiles may be required in the drain and source regions 110. Thereafter, appropriate anneal processes may be performed to re-crystallize implantation-induced damage in the active region 103 and also to activate the dopant species in the drain and source areas 110. It should be appreciated that, for a reduced gate length in the above-defined range, the sophisticated geometric configuration of the active region 103 may result in process non-uniformities, for instance during the deposition and etching of a spacer material for forming the sidewall spacer 107. Typically, the spacer structure 107 is formed by depositing an appropriate material, for instance a silicon dioxide liner (not shown) followed by a silicon nitride material, which may subsequently be selectively etched with respect to the silicon dioxide liner on the basis of well-established anisotropic etch recipes. However, at areas indicated as 112 in FIG. 1b, irregularities may be observed which may even be increased due to respective non-uniformities created during previously performed lithography processes, such as the lithography process for patterning the gate electrodes 106 and the like. Consequently, the areas 112 may have a significant influence on the further processing of the device 150, which may finally result in non-predictable behavior of the transistor 100B and thus the overall memory cell 150. For example, during the further processing, the metal silicide regions 111 may be formed by depositing a refractory metal, such as nickel, cobalt and the like, which may then be treated to react with the underlying silicon material, wherein typically the isolation structure 103 and the spacer structure 107 may substantially suppress the creation of a highly conductive metal silicide. However, due to the previously generated irregularities, respective leakage paths or even short circuits may be created, thereby undesirably influencing the final drive current capability of the transistor 100B, which may result in a less stable and reliable operation of the memory cell 150, thereby significantly contributing to yield loss of sophisticated semiconductor devices including static RAM areas.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and semiconductor devices in which the drive current capability of transistor elements formed in and above the same active region may be adjusted on the basis of different strain levels created in the respective channel regions of the transistors by means of embedding a semiconductor alloy in a local manner, thereby enabling a simplified overall geometry of the active region, which may thus, in some illustrative embodiments, be provided in a substantially rectangular configuration so that a substantially identical transistor width may be obtained for the various transistor elements while nevertheless providing a significant difference in their drive current capability. For example, in some illustrative aspects, the adjustment of the drive current capability may be accomplished for transistor elements of a memory cell, thereby obtaining the desired difference in transistor characteristics required for a stable operation of the memory cell, while at the same time ensuring a simplified overall transistor geometry compared to conventional static RAM cells. The different strain levels and thus drive currents of the transistors within the same active region may be accomplished by providing the embedded semiconductor alloy, such as silicon/germanium, silicon/germanium/tin, silicon/tin, silicon/carbon and the like, in a locally restricted manner within the active region so that the difference in strain levels may be obtained in the various channel regions of these transistors. For example, providing a silicon/germanium material spatially restricted to an N-channel transistor element requiring a reduced drive current capability may provide an increased level of compressive strain, while, on the other side, another N-channel transistor formed in and above the active region may be affected significantly less, thereby maintaining a moderately high charge carrier mobility and thus drive current. In other cases, the drive current of one or more transistors may be enhanced by providing an appropriate embedded semiconductor alloy in a spatially restricted manner while not forming the corresponding semiconductor alloy in the vicinity of other transistors requiring a reduced drive current, or forming a semiconductor alloy so as to further decrease the drive current capability of these transistors. Hence, based on spatially restricted embedded semiconductor alloys, appropriate strain levels may be generated in silicon-based active regions, thereby reducing yield losses, which may typically be observed in static RAM cells of sophisticated semiconductor devices including transistors having a gate length of approximately 50 nm and less.

One illustrative method disclosed herein comprises forming a first transistor in and above an active region formed above a substrate of a semiconductor device, wherein the first transistor has a first conductivity type. The method additionally comprises forming a second transistor in and above the active region, wherein the second transistor has the first conductivity type. Finally, the method comprises adjusting a ratio of drive current capabilities of the first and second transistors by providing a first embedded semiconductor alloy and/or a second embedded semiconductor alloy in the first transistor and/or the second transistor to induce different strain levels in a first channel region of the first transistor and a second channel region of the second transistor.

A further illustrative method disclosed herein comprises forming an active region in a semiconductor layer of a semiconductor device, wherein the active region has a substantially constant width. The method additionally comprises forming a first gate electrode structure above the active region to define a first channel region. Furthermore, a second gate electrode structure is formed above the active region to define a second channel region. Finally, the method comprises forming an embedded semiconductor alloy in the active region to induce a different strain level in the first and second channel regions.

One illustrative semiconductor device disclosed herein comprises an active semiconductor region formed above a substrate and a first transistor formed in and above the active semiconductor region, wherein the first transistor comprises a first channel region having a first strain level. The semiconductor device further comprises a second transistor formed in and above the active semiconductor region, wherein the second transistor comprises a second channel region having a second strain level that differs from the first strain level, wherein the first strain level and/or the second strain level are affected by a strain-inducing semiconductor alloy locally embedded in the active semiconductor region.

BRIEF DESCRIPTION OF THE DRAWINGS

The disclosure may be understood by reference to the following description taken in conjunction with the accompanying drawings, in which like reference numerals identify like elements, and in which.

Figure 1A:
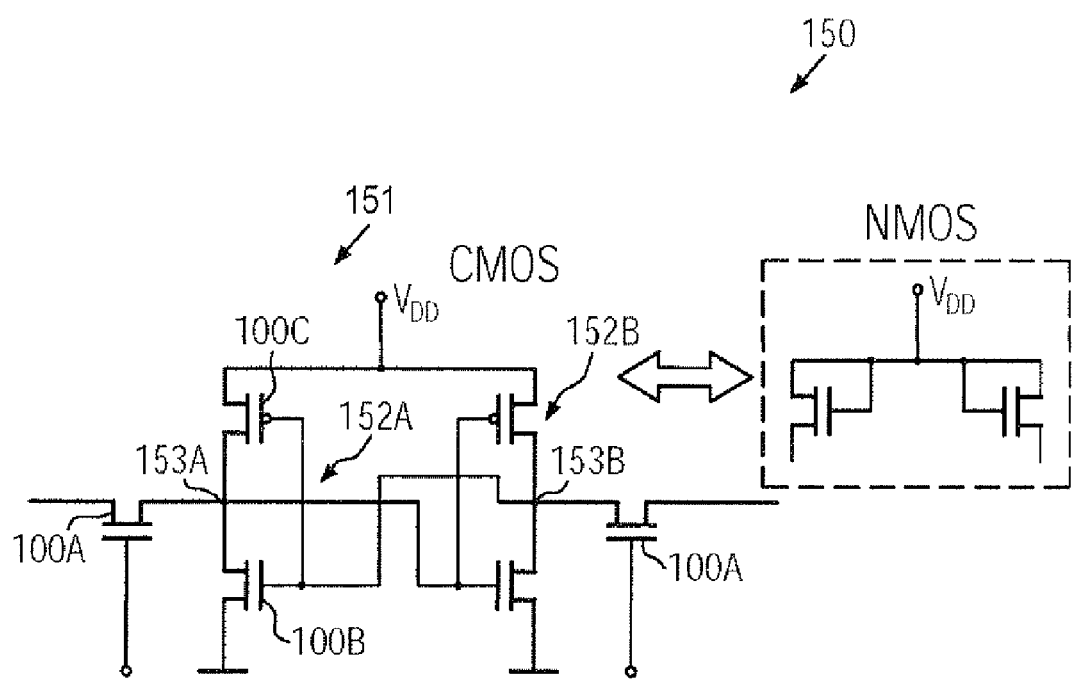
FIG. 1a schematically illustrates a circuit diagram of a conventional static RAM cell including two inverters and respective pass transistors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to methods and semiconductor devices in which the drive current capability of transistor elements formed in the same active region may be selectively adjusted by creating different strain levels locally in the active semiconductor region on the basis of a locally restricted embedded semiconductor alloy, wherein, in some illustrative aspects, substantially the same transistor width may be used for the active region, thereby providing a simplified overall geometry which may thus reduce yield losses, for instance, in static memory areas of sophisticated semiconductor devices including transistors of a gate length of approximately 50 nm and less. As is well known, strain in a semiconductor material may significantly affect the charge carrier mobility, which may thus be advantageously used for designing the overall drive current capability of transistors for an otherwise identical transistor configuration. For example, in a silicon-based crystalline active region having a standard crystal configuration, i.e., a (100) surface orientation with the transistor length direction oriented along a <110> crystal axis or an equivalent axis, the creation of a uniaxial tensile strain component along the transistor length direction may result in a significant increase of electron mobility, thereby enabling enhancement of the drive current of N-channel transistors. On the other hand, a uniaxial compressive strain component along the transistor length direction may increase mobility of holes and may reduce electron mobility, thereby enabling a reduction of the drive current capability of N-channel transistors or increasing drive current of P-channel transistors. Thus, by locally providing respective strain conditions in the channel regions of the corresponding transistor elements, a significant modulation of the drive current capabilities may be achieved for otherwise similar or substantially identical transistor configurations, for instance with respect to transistor width and length. Consequently, as previously explained, an overall geometric configuration of an active area with reduced complexity may be used, for instance, in static RAM cells, while nevertheless providing efficient strategies for adjusting the ratio of the drive current capabilities on the basis of embedded semiconductor alloys, which may be formed on the basis of well-established selective epitaxial growth techniques in a locally restricted manner within the active region under consideration. Thus, the probability of creating yield losses as may typically be observed in conventional RAM cells including a pronounced variation of the corresponding transistor width dimensions may be reduced.

It should be appreciated that the principles disclosed herein may be advantageously applied to semiconductor devices including transistor elements having a gate length of 50 nm and less, since, in these cases, pronounced yield losses may be observed for transistor elements formed in an active region having a varying width dimension. However, the present disclosure may also be applied to any device architectures irrespective of the corresponding critical dimensions and hence the present disclosure should not be construed as being restricted to specific transistor dimensions, unless such restrictions are specifically set forth in the appended claims or the specification.

Figure 1B:
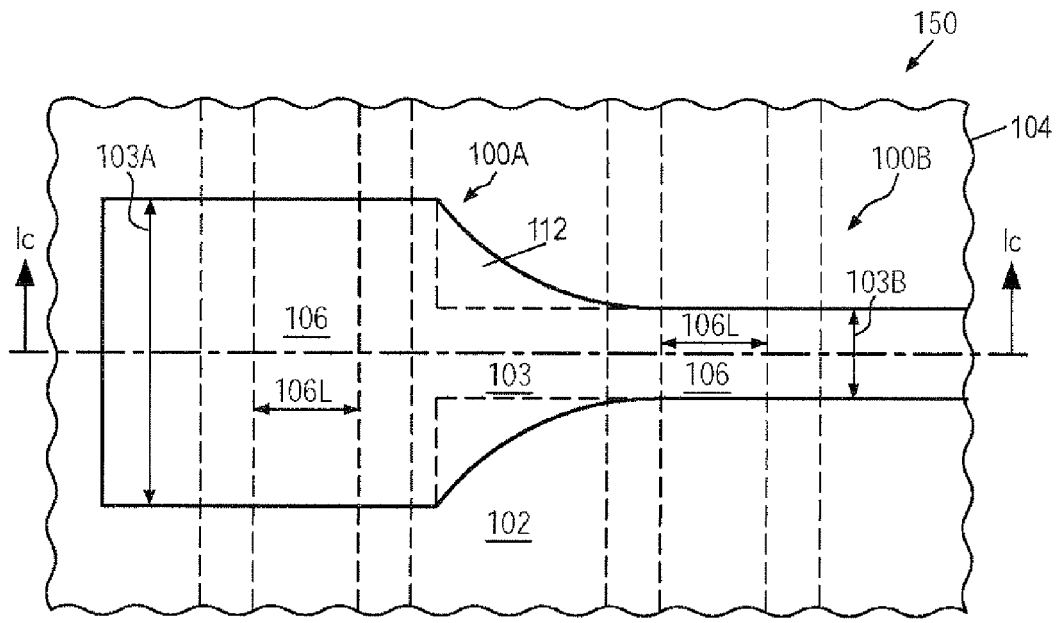
FIG. 1b schematically illustrates a top view of the memory cell of FIG. 1a, wherein a ratio of drive current capabilities is adjusted by providing different widths of the pull-down transistor and the pass transistor, according to conventional techniques.
Figure 1C:
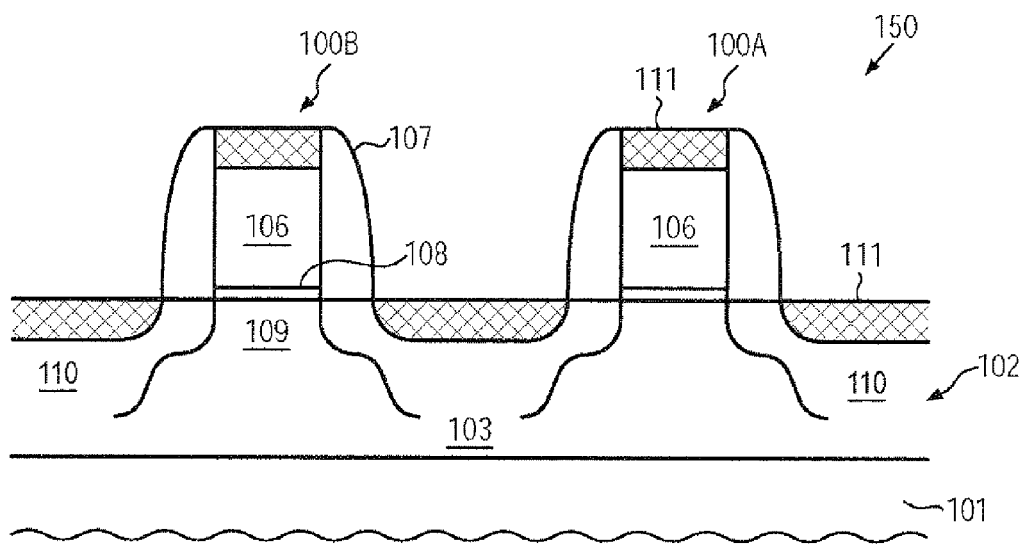
FIG. 1c schematically illustrates a cross-sectional view of the transistors shown in FIG. 1b, according to conventional techniques.

With reference to FIGS. 2*a*-2*k*, further illustrative embodiments will now be described in more detail, wherein reference may also be made to FIGS. 1*a*-1*c* when appropriate.

Figure 2A:
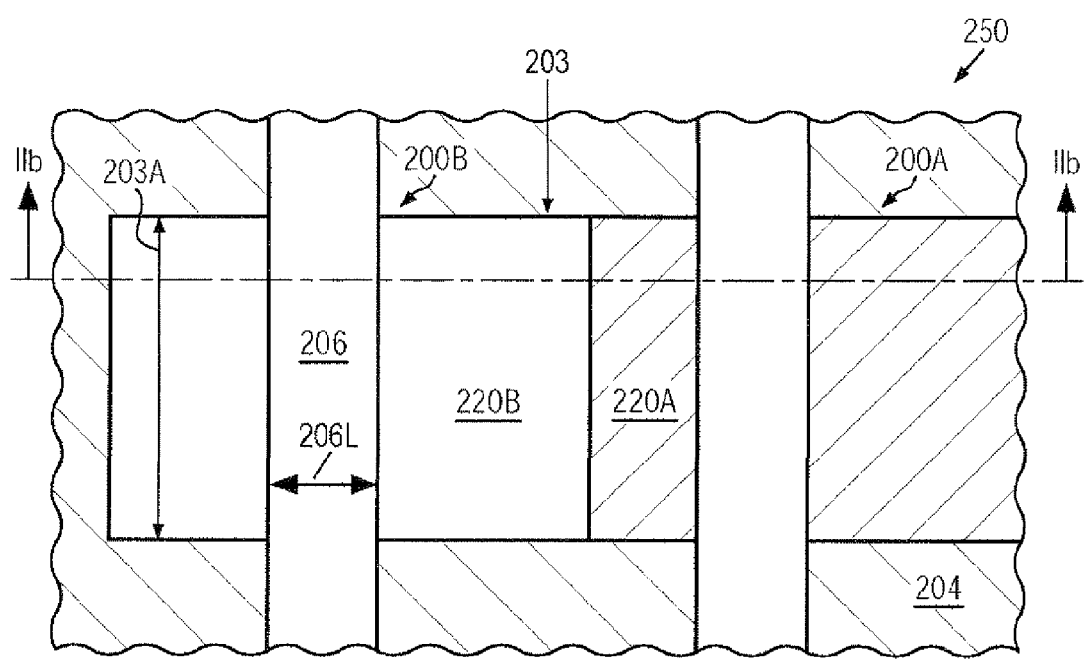
FIG. 2a schematically illustrates a top view of a portion of an active region in and above which transistors of the same conductivity type and substantially the same transistor length may be formed so as to have a different drive current capability on the basis of substantially the same transistor width by establishing different strain levels by an embedded semiconductor alloy, according to illustrative embodiments.

FIG. 2*a* schematically illustrates a top view of a semiconductor device 250, which, in one illustrative embodiment, may represent a portion of an integrated circuit in which, at least in some device areas, transistor elements of the same conductivity type are to be formed in and above a single active semiconductor region. In one embodiment, the semiconductor device 250 may represent a portion of a static RAM cell having an electrical configuration as is also explained with reference to FIG. 1*a*. The semiconductor device 250 may comprise a substrate (not shown), above which is formed a semiconductor layer (not shown), in which an isolation structure 204 that may be comprised of any appropriate insulating material, such as silicon dioxide, silicon nitride and the like, may define an active semiconductor region 203. As previously indicated, an active region is to be understood as a continuous semiconductor region without intermediate isolation structure in and above which two or more transistor elements of the same conductivity type are to be formed. As shown, the active region 203 may comprise components of a first transistor 200A and a second transistor 200B, which may represent transistors of the same conductivity type, such as N-channel transistors or P-channel transistors, which, however, may have a different drive current capability as required by the overall configuration of the device 250. In one illustrative embodiment, the first transistor 200A may represent a pass transistor of a static RAM cell, while the second transistor 200B may represent a pull-down transistor that is connected to the pass transistor 200A via the common active region 203. In one illustrative embodiment, the active region 203 may have a width dimension 203A that is substantially the same for the first transistor 200A and the second transistor 200B. That is, the width 203A may, except for any process variations, be the same for the first and second transistors 200A, 200B. In other illustrative embodiments, the width 203A may be different for the transistors 200A, 200B, however, at a less pronounced degree as is, for instance, illustrated in FIG. 1b of a conventional static RAM cell, in which a pronounced difference in the drive current capability may be accomplished by providing very different transistor widths for the pull-down transistor and the pass transistor. However, according to the principles disclosed herein, a corresponding variation of the transistor width 203A, if desired, may be provided with a less pronounced degree, since a significant difference in drive current capability between the transistors 200A, 200B may be obtained by creating different strain levels in the active region 203 on the basis of an embedded semiconductor alloy, as previously explained, so that a less sophisticated geometry of the active region 203, in combination with the locally provided embedded semiconductor alloy, may provide the desired different drive current capabilities.

In the illustrative embodiment shown in FIG. 2a, a portion of the active region 203 accommodating the first and second transistors 200A, 200B may have a substantially rectangular configuration, thereby providing efficient process conditions during lithography, etch and other processes so that enhanced overall process uniformity may be accomplished, thereby reducing yield losses, even if semiconductor devices of critical dimensions of approximately 50 nm and less are considered. In the embodiment shown, the transistors 200A, 200B may each comprise a gate electrode 206 having, in some illustrative embodiments, a length 206L of 50 nm or less, wherein, for instance, the length 206L may be substantially equal for each of the transistors, except for process variations. Furthermore, a portion of the active region 203 corresponding to the first transistor 200A may have a first internal strain level, indicated by 220A, while a portion of the region 203 corresponding to the second transistor 200B may have a second internal strain level 220B, which differs from the level 220A in type of strain and/or magnitude of strain, wherein the strain levels 220A, 220B may be induced by providing at least one embedded semiconductor alloy, such as silicon/germanium, silicon/carbon, silicon/germanium/tin, silicon/tin and the like, in a locally restricted manner within the active region 203. That is, the strain levels 220A, 220B may represent the same type of strain, such as tensile strain or compressive strain, while the amount thereof may be different, while, in other cases, the type of strain, i.e., compressive strain or tensile strain, may be different in the first and second transistors 200A, 200B, while, if desired, the amount of the corresponding different types of strain may also differ. Consequently, as previously explained, the different strain levels 220A, 220B locally provided in the active region 203 on the basis of at least one embedded semiconductor alloy may create different charge carrier mobilities in the corresponding channel regions, which may thus result in different drive current capabilities for the transistors 200A, 200B.

Figure 2B:
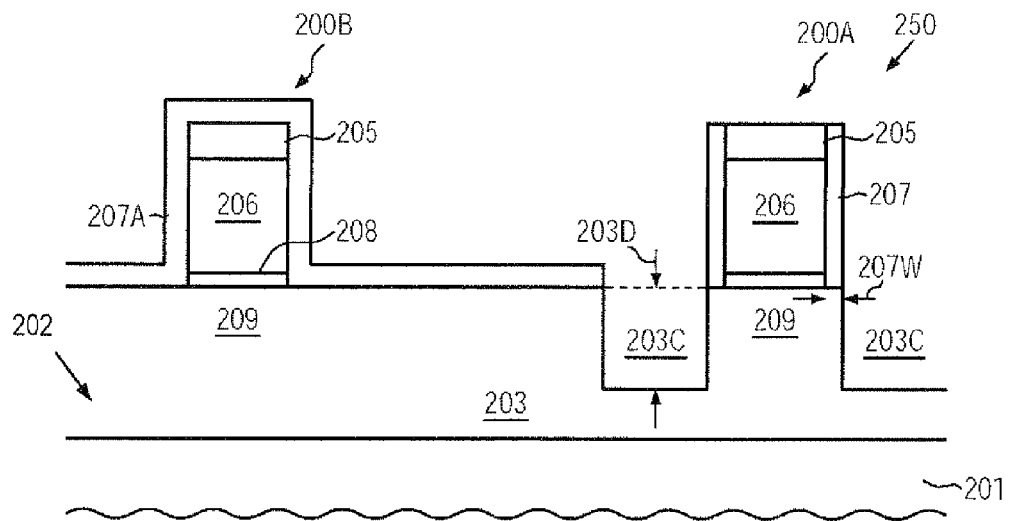
FIGS. 2b-2e schematically illustrate cross-sectional views of a portion of the active region including two transistors of different drive current during various manufacturing stages in locally providing an embedded semiconductor alloy so as to obtain different strain levels and thus drive currents of the transistors, according to illustrative embodiments.

FIG. 2b schematically illustrates a cross-sectional view of the device 250 along the line IIb of FIG. 2a. As illustrated, the device 250 may comprise a substrate 201 above which may be formed a semiconductor layer 202, in which the active region 203 is defined by isolation structures (not shown in FIG. 2b), such as the isolation structure 204 of FIG. 2a. The substrate 201, in combination with the semiconductor layer 202, may define a bulk configuration, i.e., the semiconductor layer 202 may represent an upper portion of a crystalline semiconductor material of the substrate 201. In other cases, an SOI configuration may be provided, when a buried insulating layer (not shown) is provided between the substrate 201 and the semiconductor layer 202. It should be appreciated that a bulk configuration and an SOI configuration may commonly be provided in the device 250 in different device areas, if required. Furthermore, in the manufacturing stage shown, the transistors 200A, 200B may comprise the gate electrodes 206, which are separated from channel regions 209 by gate insulation layers 208. Moreover, the gate electrodes 206 may be encapsulated by a dielectric material, such as silicon nitride, silicon dioxide and the like, so as to protect the gate electrodes 206 during an etch process for forming cavities 203C, for instance, adjacent to the gate electrode 206 of the first transistor 200A. For this purpose, the first transistor 200A may comprise a spacer element 207 in combination with a cap layer 205. On the other hand, the second transistor 200B and a corresponding portion of the active region 203 may be covered by a spacer layer 207A. Thus, by means of the spacer layer 207A, the degree of coverage of the active region 203 and thus the area protected during a corresponding etch process for forming the cavities 203C may be adjusted. Similarly, by selecting an appropriate width of the spacers 207, as indicated by 207W, a lateral distance of the cavities 203C with respect to the adjacent channel region 209 of the first transistor 200A may be adjusted, wherein corresponding etch characteristics may also be taken into consideration, such as the degree of isotropic etch behavior and the like. Similarly, a depth 203D may be selected in accordance with the desired strain level to be established for the first transistor 200A.

A typical process flow for forming the semiconductor device 250 may comprise the following processes. First, the active region 203 may be defined by forming the isolation structure 204 (FIG. 2a) which may be accomplished on the basis of photolithography, etch, deposition and planarization techniques, as is similarly described above with reference to the device 150, wherein, however, a geometric configuration of the active region 203 may be provided with reduced complexity compared to conventional devices so that process-related non-uniformities in a later manufacturing stage may be suppressed. Thereafter, an appropriate basic dopant concentration may be established, as previously explained, and the gate insulation layers 208 and the gate electrodes 206 may be formed in accordance with well-established process techniques. During the formation of the gate electrodes 206, the cap layer 205 may also be provided, for instance, in the form of a silicon nitride material. Thereafter, the spacer layer 207A may be deposited, for instance, by thermally activated chemical vapor deposition (CVD) with a desired thickness, which may substantially correspond to the width 207W of the spacers 207. Next, the spacer layer 207A may be patterned by photolithography and anisotropic etch techniques, thereby providing the layer 207A as shown and the spacer elements 207. Thereafter, a corresponding resist mask used for patterning the layer 207A may or may not be removed when performing a further etch process for creating the cavities 203C, wherein the parameters 207W and 203D may be adjusted with respect to a certain desired strain level induced by a semiconductor alloy to be formed within the recesses 203C. It should be appreciated that, if corresponding cavities 203C are also to be formed in other device areas, such as speed critical device areas and the like, a common manufacturing sequence may be used wherein the corresponding parameters 207W and 203D may be appropriately targeted to meet the requirements of the transistor 200A and of corresponding speed critical devices.

Figure 2C:
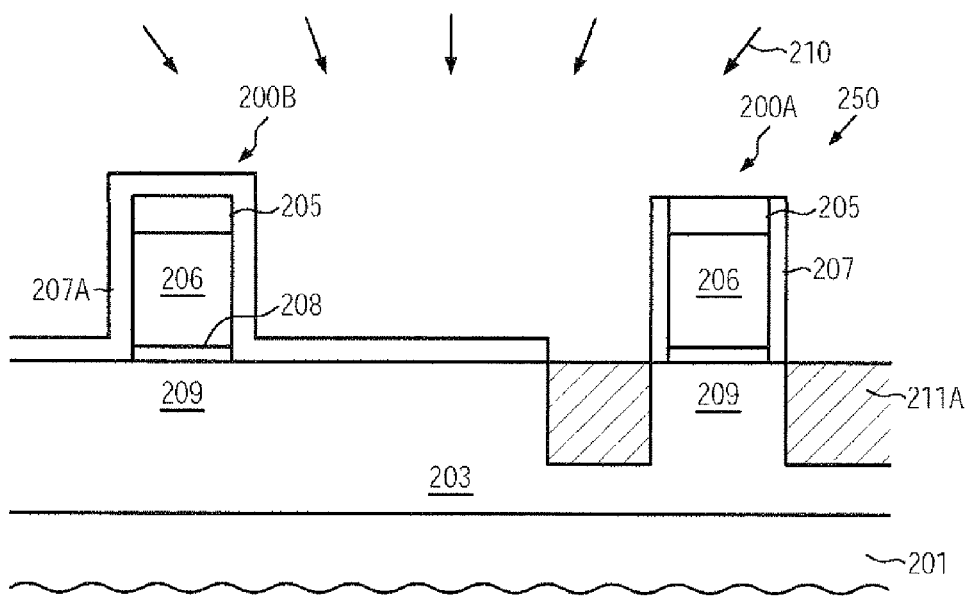

FIG. 2c schematically illustrates the semiconductor device 250 in a further advanced manufacturing stage, in which a selective epitaxial growth process 210 may be performed on the basis of well-established deposition recipes, thereby forming a semiconductor alloy 211A within the recesses 203C. For example, if the transistor 200A represents a pass transistor requiring a reduced drive current capability compared to the transistor 200B, which may represent a pull-down transistor of a memory cell, as previously explained, the embedded semiconductor alloy 211A may be provided by any appropriate material composition that induces a strain component in the channel region 209 that reduces charge carrier mobility therein. For example, if the transistors 200A, 200B represent N-channel transistors, the semiconductor alloy 211A may be provided in the form of a silicon/germanium alloy, a silicon/tin alloy, a silicon/germanium/tin alloy and the like that has a greater natural lattice constant compared to silicon, thereby growing in a compressively strained state, which may thus provide a uniaxial compressive strain component in the transistor 200A. In other cases, when the transistor 200A may require an increased drive capability compared to the transistor 200B, the material 211A may be provided, for instance, in the form of silicon/carbon material providing a tensile strain component, when the transistors 200A, 200B represent N-channel transistors. On the other hand, when P-channel transistors are considered, the above-explained material compositions may be provided inversely for the above-described situation.

Figure 2D:
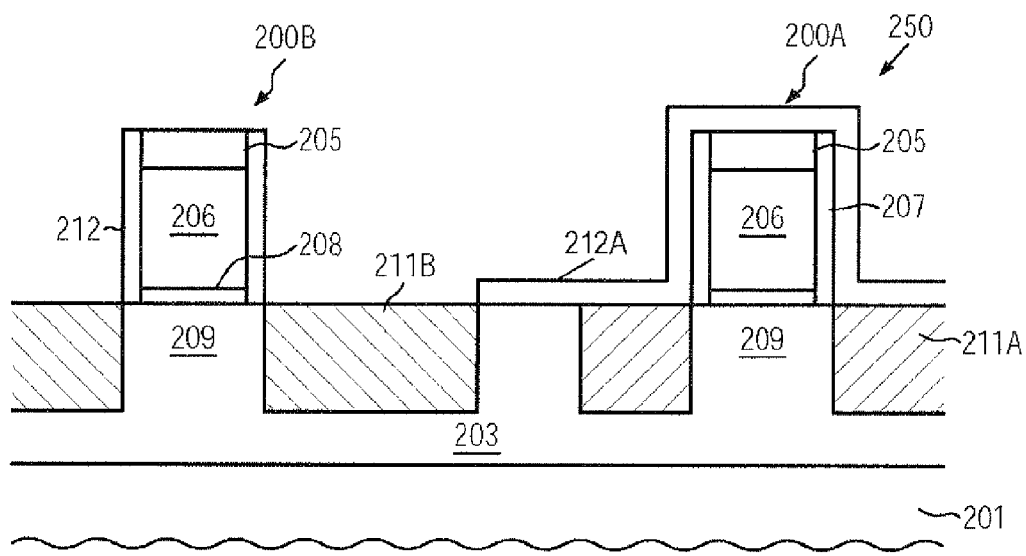

FIG. 2d schematically illustrates the semiconductor device 250 according to further illustrative embodiments in which a second embedded semiconductor alloy 211B may be positioned in a spatially restricted manner in the vicinity of the second transistor 200B, thereby inducing an appropriate type of strain in the adjacent channel region 209 of the transistor 200B. For this purpose, an appropriate mask or spacer layer 212A may cover the first transistor 200A and a corresponding portion of the active region 203, while a spacer element 212 may protect the gate electrode 206 of the second transistor 200B in combination with the cap layer 205. Thus, corresponding cavities may be etched in the active region 203 for the second transistor 200B and subsequently a respective selective epitaxial growth process may be performed on the basis of well-established deposition techniques in order to form the embedded semiconductor alloy 211B. For example, the alloy 211B may induce a strain in the transistor 200B so as to enhance charge carrier mobility, which may be accomplished on the basis of a silicon/carbon alloy, when N-channel transistors are considered. Thus, an even increased difference in strain levels for the first transistor 200A and the second transistor 200B may be accomplished on the basis of the two different embedded semiconductor alloys 211A, 211B.

Figure 2E:
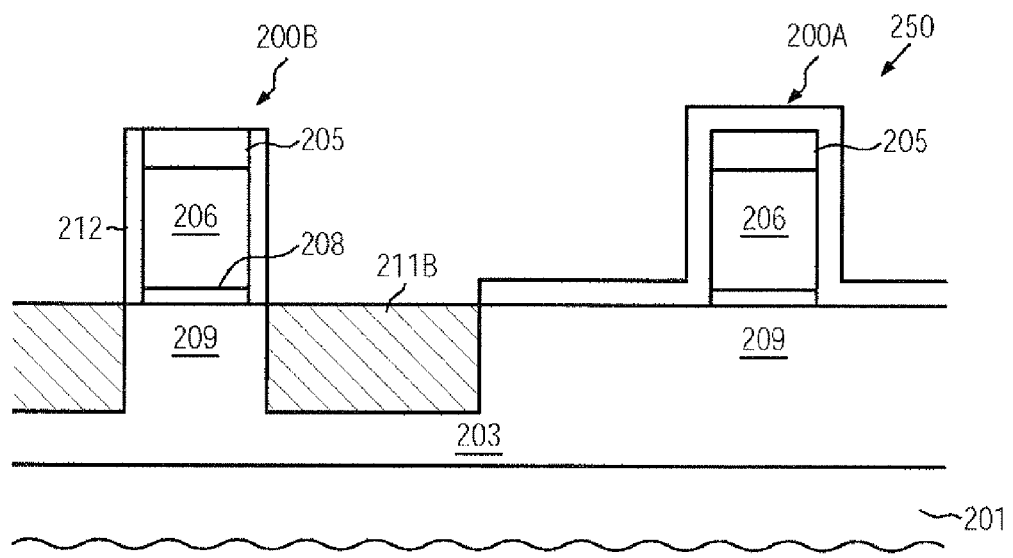

FIG. 2e schematically illustrates the semiconductor device 250 according to further illustrative embodiments in which an embedded semiconductor alloy, such as the semiconductor alloy 211B, may be formed in a spatially restricted manner in the vicinity of the second transistor 200B, while the first transistor 200A may not receive an embedded semiconductor alloy, thereby substantially restricting the strain-inducing mechanism to the second transistor 200B.

Figure 2F:
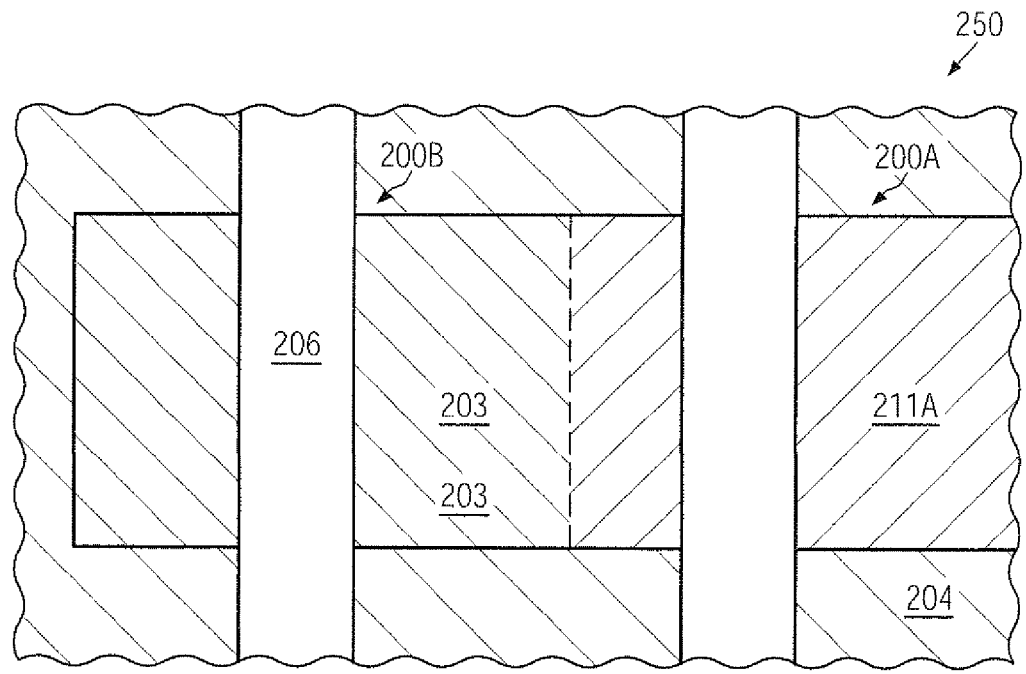
FIGS. 2f-2h schematically illustrate top views of the semiconductor device according to various variants of different strain levels generated by one or more embedded semiconductor alloys in the same active region, according to further illustrative embodiments.

FIG. 2f schematically illustrates a top view of the device 250, in which the first transistor 200A may comprise the embedded semiconductor alloy 211A, thereby providing a compressive strain level that is substantially restricted to the transistor 200A, while affecting the second transistor 200B in a significantly less pronounced manner. For convenience, the local strain level in the active region 203 corresponding to the second transistor 200B may be indicated as "neutral," wherein it should be appreciated that a certain degree of influence of the embedded semiconductor alloy 211A may still act on the second transistor 200B. Thus, for N-channel transistors, a compressive strain component of the material 211A may reduce drive current capability of the first transistor 200A, while substantially maintaining a desired moderately high drive current capability for the second transistor 200B, as may be required for static RAM cells, when the transistors 200A, 200B represent a pass transistor and a pull-down transistor, respectively.

Figure 2G:
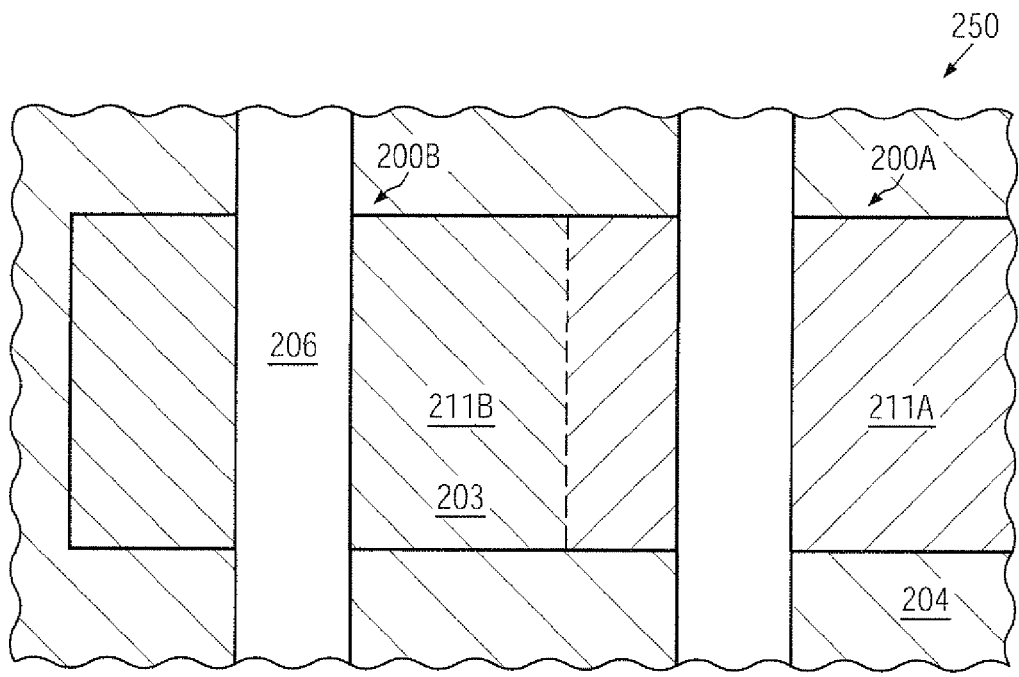

FIG. 2g schematically illustrates the semiconductor device 250 according to further illustrative embodiments similar to the embodiment as described with reference to FIG. 2d. That is, the first transistor 200A may comprise the locally restricted embedded semiconductor material 211A, for instance providing compressive strain, while the second transistor 200B may comprise the semiconductor alloy 211B in a spatially restricted manner, thereby providing a tensile strain component. Hence, for N-channel transistors, the transistor 200A may have a reduced drive current, while the tensile strain may increase the drive current of the second transistor 200B, thereby providing a further pronounced difference in overall drive current capabilities of the transistors 200A, 200B.

Figure 2H:
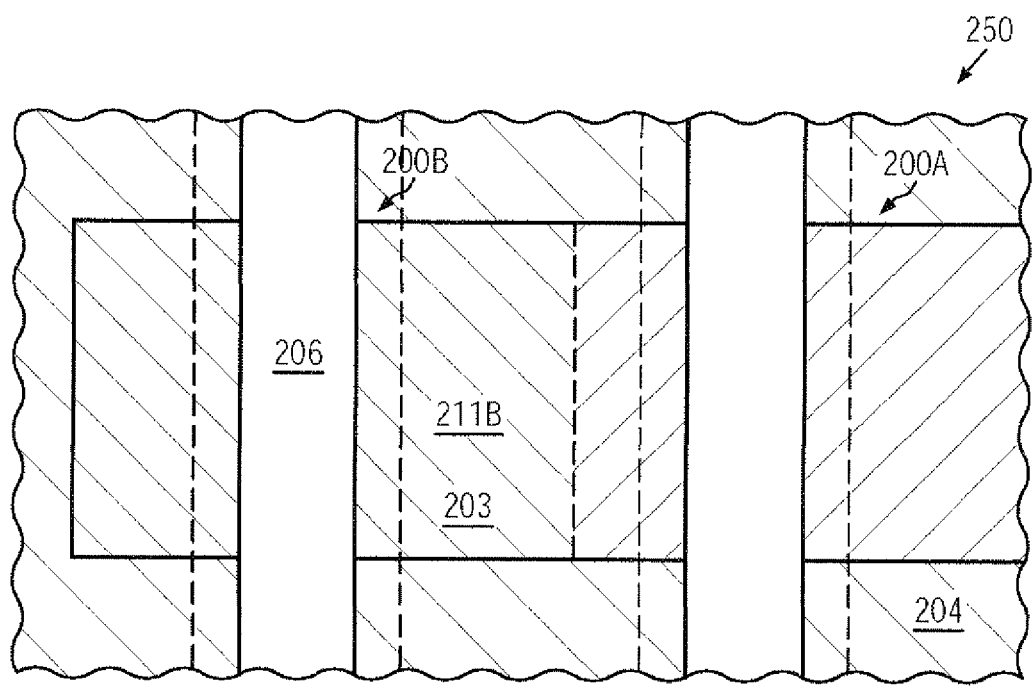

FIG. 2h schematically illustrates a top view of the semiconductor device 250 according to the embodiment as also shown in FIG. 2e. Hence, the second transistor 200B may comprise the embedded semiconductor alloy 211B, while the first transistor 200A may be substantially "neutral," which is to be understood in the above-defined sense.

Consequently, an efficient "patterning" of the drive current capabilities within a continuous active region, such as the active region 203, may be accomplished by providing at least one embedded semiconductor alloy in a locally restricted manner, which may provide the possibility of using simplified geometrical configurations of the active region 203, for instance in static RAM cells and the like. It should be appreciated that a corresponding adjustment of the drive current capabilities within the active region 203 may also be accomplished for P-channel transistors, for instance by providing a compressive strain-inducing semiconductor alloy in a transistor requiring an increased drive current capability and/or providing a tensile strain-inducing semiconductor alloy in a transistor requiring a reduced drive current capability.

Figure 2I:
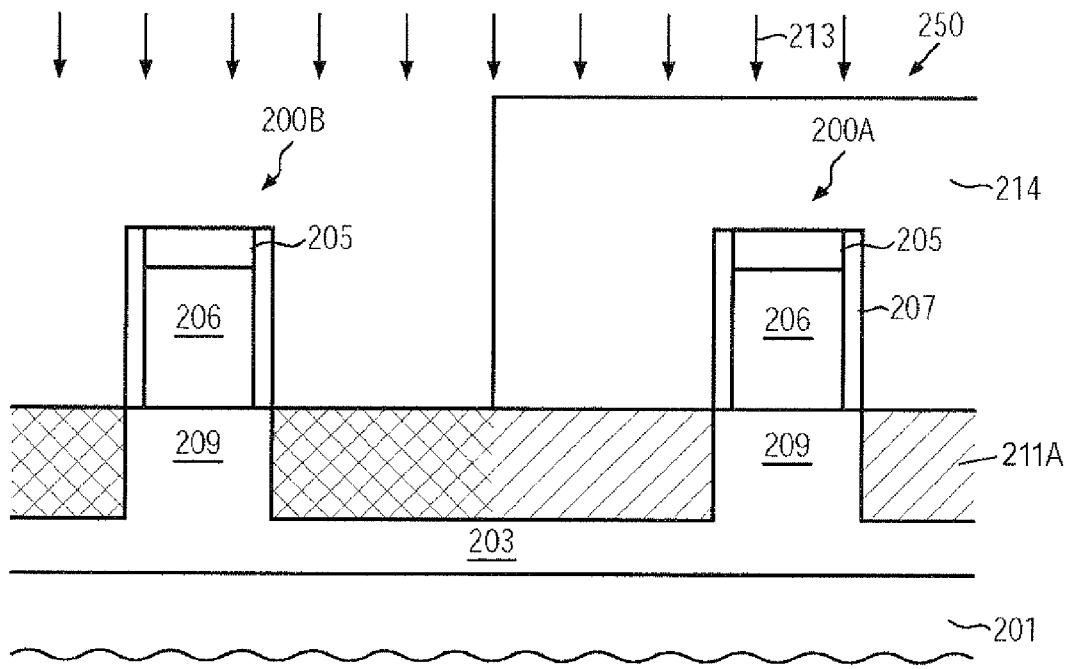
FIG. 2i schematically illustrates a cross-sectional view of the semiconductor device in which different strain levels may be accomplished by an embedded semiconductor alloy and an associated strain relaxation in a local manner, according to still further illustrative embodiments.

FIG. 2i schematically illustrates the semiconductor device 250 according to a further illustrative embodiment in which an embedded semiconductor alloy, such as the alloy 211A, may be formed with a less pronounced degree of local restriction, for instance the alloy 211A may be formed in the vicinity of two or more transistors, such as the transistors 200A, 200B, wherein a local patterning of the various strain levels may be accomplished by a relaxation implantation process 213. For this purpose, a process sequence may be used, as previously described with reference to FIGS. 2b-2c, wherein, however, corresponding cavities may commonly be formed for both transistors 200A, 200B. Thereafter, the selective epitaxial growth process may be performed for both transistors, thereby providing the semiconductor alloy 211A. It should be appreciated that process uniformity during the etch process and during the subsequent selective epitaxial growth process may be enhanced due to a more uniform surface topography within the active region 203. Thereafter, a resist mask 214 may be formed on the basis of well-established lithography techniques, wherein the mask 214 may expose a desired portion in the vicinity of the second transistor 200B, in which the strain level induced by the semiconductor alloy 211A may not be desired. Thereafter, the implantation process 213 may be performed, for instance on the basis of an inert species, such as xenon, silicon and the like, thereby creating heavy crystal damage, which may result in a corresponding reduction of the intrinsic strain level. Thus, the charge carrier mobility within the channel region 209 of the second transistor 200B may remain substantially unaffected by the semiconductor alloy 211A, wherein, additionally, the modified electronic characteristics of the alloy 211A in drain and source areas of the transistor 200B may provide enhanced drive current capabilities, which may also contribute to a pronounced difference in the corresponding drive currents. Hence, after removal of the resist mask 214, the further processing may be continued, for instance by forming drain and source regions, as is also described with reference to the semiconductor device 150.

It should be appreciated that other masking regimes may be used, for instance when the semiconductor alloy 211B may be provided, so that the first transistor 200A may be exposed by the mask 214 in order to obtain a relaxed semiconductor alloy 211B adjacent to the first transistor 200A. With respect to P-channel transistors, the same criteria apply as previously explained. That is, the concept of providing a single embedded semiconductor alloy and a subsequent local relaxation thereof may be applied to P-channel transistors and N-channel transistors, depending on the overall process and device requirements.

Figure 2J:
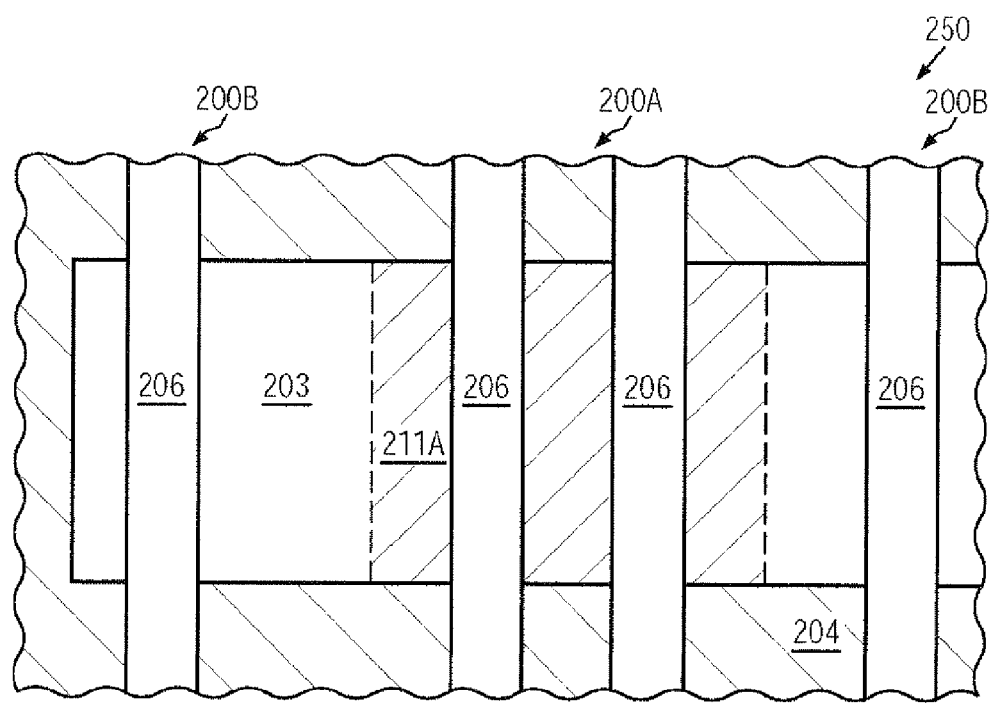
FIG. 2*j* schematically illustrates a top view of the semiconductor device in which more than two transistors may be provided in and above a common active region, thereby providing different strain levels for at least two different transistor types on the basis of a locally provided embedded semiconductor alloy, according to still further illustrative embodiments.

FIG. 2j schematically illustrates a top view of the semiconductor device 250, which may represent a portion of a typical memory cell in which two pass transistors 200A may be formed in close proximity and in and above the active region 203 together with two pull-down transistors 200B, which may laterally enclose the pass transistors 200A. Also, in this configuration, an efficient adaptation of the drive current capabilities may be accomplished on the basis of the above-described principles. For example, as shown, the pass transistors 200A, requiring a reduced drive current capability compared to the pull-down transistors 200B, may have formed therein an embedded semiconductor alloy 211A, for instance in the form of a silicon/germanium material, thereby reducing charge carrier mobility, if N-channel transistors are considered. On the other hand, the pull-down transistors 200B may not be substantially affected by the material 211A, thereby providing a moderately high drive current. It should be appreciated, however, that any of the above-described regimes for local patterning of the strain levels in the active region 203 may also be applied to the device 250 as shown in FIG. 2j.

Figure 2K:
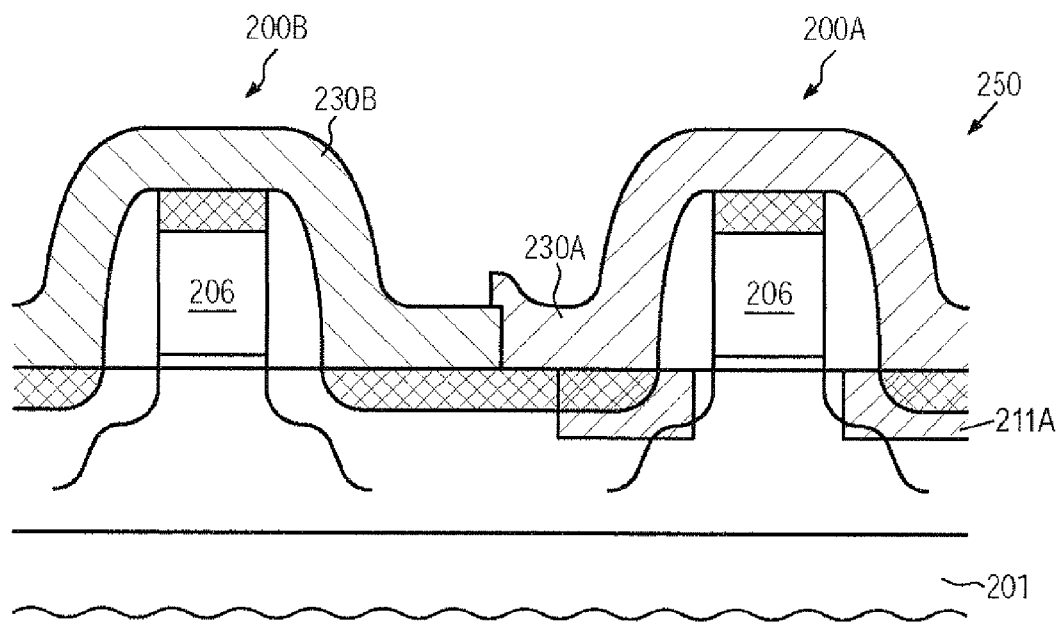
FIG. 2*k* schematically illustrates the semiconductor device comprising an additional strain-inducing mechanism in the form of a stressed dielectric material formed above transistors that are positioned in and above the same active region, according to still further illustrative embodiments.

FIG. 2k schematically illustrates the semiconductor device 250 according to further illustrative embodiments in which, in addition to the strain-inducing mechanism described above, at least one further strain-inducing mechanism may be provided. In the embodiment illustrated, at least one of the transistors 200A, 200B may have formed thereabove a stress-inducing dielectric material, for instance in the form of silicon nitride material, nitrogen-containing silicon carbide and the like. For example, the transistor 200A may comprise, in addition to the embedded semiconductor alloy 211A, a compressively stressed dielectric layer 230A, which may enhance the overall strain-inducing mechanism in the transistor 200A. In other illustrative embodiments, the transistor 200B may comprise a corresponding stress-inducing layer 230B, which may represent a substantially stress-neutral layer, which may have a different type or magnitude of stress level compared to the layer 230A. Consequently, the layers 230A, 230B may provide a wider range of process margins in order to obtain a desired difference in current drive capability. For example, if strain-inducing parameters, such as a depth of the strain-inducing material 211A, a composition thereof, i.e., a degree of lattice mismatch with respect to the surrounding material, a lateral distance thereof from the corresponding channel region and the like, may have to be selected so as to comply with the requirements of transistor elements in other device regions, the layers 230A, 230B may provide a further parameter for adjusting the overall difference in drive current capability.

The dielectric layers 230A, 230B may be formed on the basis of well-established process techniques, including plasma assisted CVD techniques, in which materials such as silicon nitride, nitrogen-containing silicon carbide and the like may be deposited with varying stress levels and types of stresses by selecting appropriate deposition parameters. Furthermore, if the corresponding internal stress conditions of one or both of the layers 230A, 230B may have to be specifically adapted to the transistors 200A, 200B independent from the stress characteristics of these layers in other device areas, one or more stress relaxation implantations may be performed, which may be accomplished on the basis of a xenon implantation with an associated masking regime.

As a result, the present disclosure provides methods and semiconductor devices in which the drive current capability of transistors formed in and above the same active region may be adjusted on the basis of a locally adapted strain level obtained on the basis of at least one embedded semiconductor alloy so that an overall transistor configuration of reduced complexity may be obtained, while nevertheless providing a significant difference in drive current capability. In some illustrative embodiments, a pull-down transistor and a pass transistor of a static RAM cell may be formed in a common active region without requiring a pronounced variation of the transistor width of these transistor elements, since the different drive current may be efficiently adjusted on the basis of a strain-inducing mechanism provided by the at least one embedded semiconductor alloy, which may locally act in a different manner for these transistors. For example, a substantially rectangular configuration may be used for the common active semiconductor region of one or more pass transistors and one or more pull-down transistors, thereby providing enhanced conditions during lithography and etch processes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first transistor in and above an active region formed above a substrate of a semiconductor device, said first transistor having a first conductivity type;
forming a second transistor in and above said active region, said second transistor having said first conductivity type; and
adjusting a ratio of drive current capabilities of said first and second transistors by providing a first embedded semiconductor alloy in said first transistor and providing a second embedded semiconductor alloy in said second transistor and selectively relaxing a strain generated by the first embedded semiconductor alloy in the first transistor so as to induce different strain levels in a first channel region of said first transistor and a second channel region of said second transistor.

2. The method of claim 1, wherein said first and second transistors have substantially the same transistor width.

3. The method of claim 1, wherein selectively relaxing said first embedded semiconductor alloy comprises performing a selective implantation process with an inert species to relax said strain generated by the first embedded semiconductor alloy in the first transistor.

4. The method of claim 1, wherein said first and second embedded semiconductor alloys comprise the same material.

5. The method of claim 1, wherein adjusting a ratio of drive current capabilities of said first and second transistors comprises providing said first embedded semiconductor alloy in said first transistor, wherein said first embedded semiconductor alloy reduces a charge carrier mobility in said first channel region.

6. The method of claim 5, wherein said first embedded semiconductor alloy comprises at least one of silicon, germanium and tin.

7. The method of claim 1, wherein providing said first embedded semiconductor alloy and said second embedded semiconductor alloy comprises forming cavities in drain and source areas said first and second transistors, filling said cavities of said first transistor with said first embedded semiconductor alloy, and filling cavities of said second transistor with said second embedded semiconductor alloy.

8. The method of claim 7, wherein adjusting different strain levels in said first and second channel regions comprises adjusting at least one of a size of said cavities, a distance of said cavities with respect to said first and second channel regions and a composition of said at least one of a first embedded semiconductor alloy and a second embedded semiconductor alloy.

9. The method of claim 1, further comprising forming a strain-inducing dielectric layer above at least one of said first and second transistors.

10. The method of claim 9, wherein a compressive strain-inducing dielectric layer is selectively formed above said first transistor and said first embedded semiconductor alloy is formed in said first transistor so as to induce a compressive strain.

11. The method of claim 10, wherein a tensile strain-inducing dielectric layer is selectively formed above said second transistor.

12. A semiconductor device, comprising:
an active semiconductor region formed above a substrate;
a first pass transistor formed in and above said active semiconductor region, said first pass transistor comprising a first channel region having a first strain level;
a first inverter transistor having a first conductivity type formed in and above said active semiconductor region, said first inverter transistor comprising a second channel region having a second strain level that differs from said first strain level, at least one of said first and second strain levels being affected by a strain-inducing semiconductor alloy locally embedded in said active semiconductor region;
a second pass transistor formed in and above said active semiconductor region and having the same configuration with respect to said first strain level as the first pass transistor; and
a second inverter transistor formed in and above said active semiconductor region and having the first conductivity type and the same configuration with respect to said second strain level as the first inverter transistor, wherein said first and second pass transistors and said first and second inverter transistors represent transistors of a memory cell.

13. The semiconductor device of claim 12, wherein said strain-inducing semiconductor alloy is spatially restricted to said first transistor so as to induce a first type of strain in said first channel region while inducing a said first type of strain in a less pronounced manner in said second channel region.

14. The semiconductor device of claim 12, wherein said first transistor has a first drive current capability that is less than a second drive current capability of said second transistor.

15. The semiconductor device of claim 12, wherein said first and second transistors comprise pull-down transistors.

16. The semiconductor device of claim 12, wherein a transistor width of said first and second transistors is substantially identical.

17. The semiconductor device of claim 16, wherein said strain-inducing semiconductor alloy is spatially restricted to said second transistor so as to induce a second type of strain in said second channel region while inducing said second type of strain in a less pronounced manner in said first channel region, wherein said second type of strain differs from said first type of strain.

* * * * *